(12) United States Patent
Ong et al.

(10) Patent No.: US 12,484,207 B2
(45) Date of Patent: Nov. 25, 2025

(54) SRAM WITH CHANNEL COUNT CONTRAST FOR GREATER READ STABILITY

(71) Applicant: Intel Corporation, Santa Clara, CA (US)

(72) Inventors: Clifford Ong, Portland, OR (US); Leonard Guler, Hillsboro, OR (US); Mohammad Hasan, Aloha, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 717 days.

(21) Appl. No.: 17/560,913

(22) Filed: Dec. 23, 2021

(65) Prior Publication Data

US 2023/0209798 A1 Jun. 29, 2023

(51) Int. Cl.
| | |
|---|---|
| *H01L 27/11* | (2006.01) |
| *H01L 29/06* | (2006.01) |
| *H01L 29/423* | (2006.01) |
| *H01L 29/66* | (2006.01) |
| *H01L 29/786* | (2006.01) |
| *H10B 10/00* | (2023.01) |

(Continued)

(52) U.S. Cl.
CPC ......... *H10B 10/125* (2023.02); *H10D 30/031* (2025.01); *H10D 30/6735* (2025.01); *H10D 30/6757* (2025.01); *H10D 62/118* (2025.01)

(58) Field of Classification Search
CPC ............... H10B 10/125; H10D 30/031; H10D 30/6735; H10D 30/6757; H10D 62/118; H10D 30/014; H10D 30/43; H10D 62/121; H10D 84/0128; H10D 84/038; H10D 84/83; B82Y 10/00

USPC .......................................................... 257/369
See application file for complete search history.

(56) References Cited

U.S. PATENT DOCUMENTS 9,437,501 B1 9/2016 Cheng et al.
10,170,484 B1 * 1/2019 Sung .................. H10D 30/6735
(Continued)

FOREIGN PATENT DOCUMENTS

| EP | 3581543 | 12/2019 |
|---|---|---|
| EP | 3644375 | 4/2020 |
| EP | 3678170 | 7/2020 |

OTHER PUBLICATIONS

"" Non-Final Office Action from U.S. Appl. No. 16/905,743 notified Dec. 28, 2023, 9 pgs.

(Continued)

*Primary Examiner* — Tong-Ho Kim
(74) *Attorney, Agent, or Firm* — Essential Patents Group, LLP

(57) ABSTRACT

Integrated circuit (IC) static random-access memory (SRAM) bit-cell structures comprising pass-gate transistors having a different number of active channel regions than the number of active channel regions in pull-down transistors. A pass-gate transistor with fewer active channel regions than a pull-down transistor may reduce read instability of an SRAM bit-cell, and/or reduce overhead associated with read assist circuitry coupled to the bit-cell. In some examples, one or more pass-gate transistor channel regions are impurity doped or removed from either a top side or bottom side of the pass-gate transistors to depopulate the number of active channel regions relative to a pull-down transistor.

17 Claims, 9 Drawing Sheets

(51) Int. Cl.
  *H10D 30/01* (2025.01)
  *H10D 30/67* (2025.01)
  *H10D 62/10* (2025.01)

(56) References Cited

U.S. PATENT DOCUMENTS

| | | |
|---|---|---|
| 2010/0264496 A1 | 10/2010 | Thomas et al. |
| 2011/0031473 A1 | 2/2011 | Chang et al. |
| 2014/0269022 A1 | 9/2014 | Xie et al. |
| 2017/0018462 A1 | 1/2017 | Suk et al. |
| 2017/0084756 A1* | 3/2017 | Cheng ............... H10D 84/0167 |
| 2017/0140933 A1 | 5/2017 | Lee et al. |
| 2018/0040695 A1 | 2/2018 | Smith et al. |
| 2018/0294284 A1 | 10/2018 | Tarakji et al. |
| 2019/0043560 A1* | 2/2019 | Sumbul ................ G11C 11/419 |
| 2019/0252495 A1 | 8/2019 | Bao et al. |
| 2020/0066839 A1 | 2/2020 | Zhang et al. |
| 2020/0105756 A1 | 4/2020 | Crum et al. |
| 2020/0135929 A1 | 4/2020 | Van Dal et al. |
| 2020/0219970 A1* | 7/2020 | Mannebach ......... H10D 62/115 |
| 2021/0257452 A1 | 8/2021 | Trivedi et al. |
| 2021/0296323 A1* | 9/2021 | Zheng ................... H10D 62/60 |
| 2021/0376162 A1 | 12/2021 | Van Dal |
| 2021/0398977 A1* | 12/2021 | Mishra ............... H10D 84/0167 |

OTHER PUBLICATIONS

Extended European Patent Application No. 17/560,913 notified May 16, 2023, 9 pgs.
Huang, Ya-Chi, et al., "An Area Efficient Low-Voltage 6-T SRAM Cell Using Stacked Silicon Nanowires", ICICDT 2018, Otranto, Italy, Session F—Advanced Memory Devices, 4 pgs.
Non-Published, U.S. Appl. No. 16/905,743, filed Jun. 18, 2020.
Non-Published, U.S. Appl. No. 17/473,427, filed Sep. 13, 2021.
Non-Published, U.S. Appl. No. 17/473,431, filed Sep. 13, 2021.

* cited by examiner

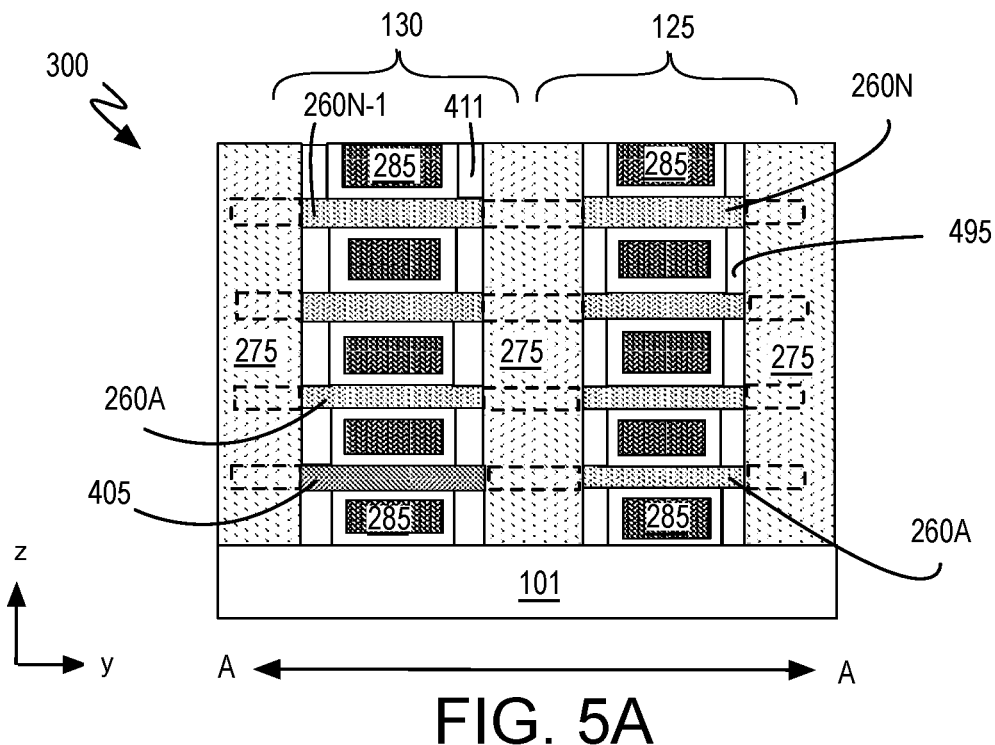
FIG. 5A
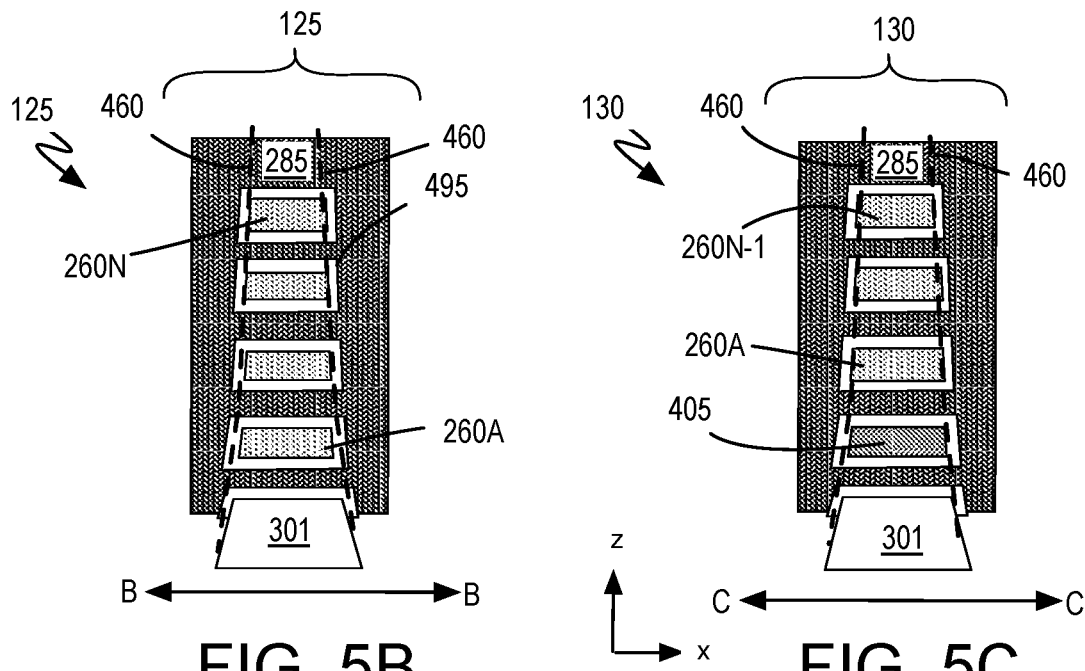
FIG. 5B
FIG. 5C

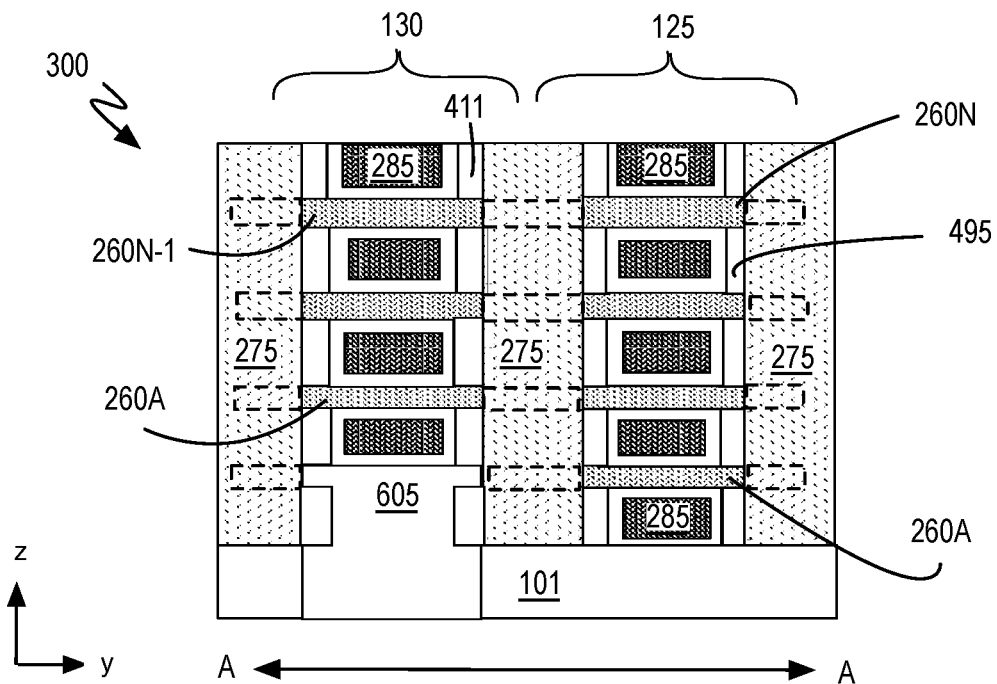
FIG. 7A
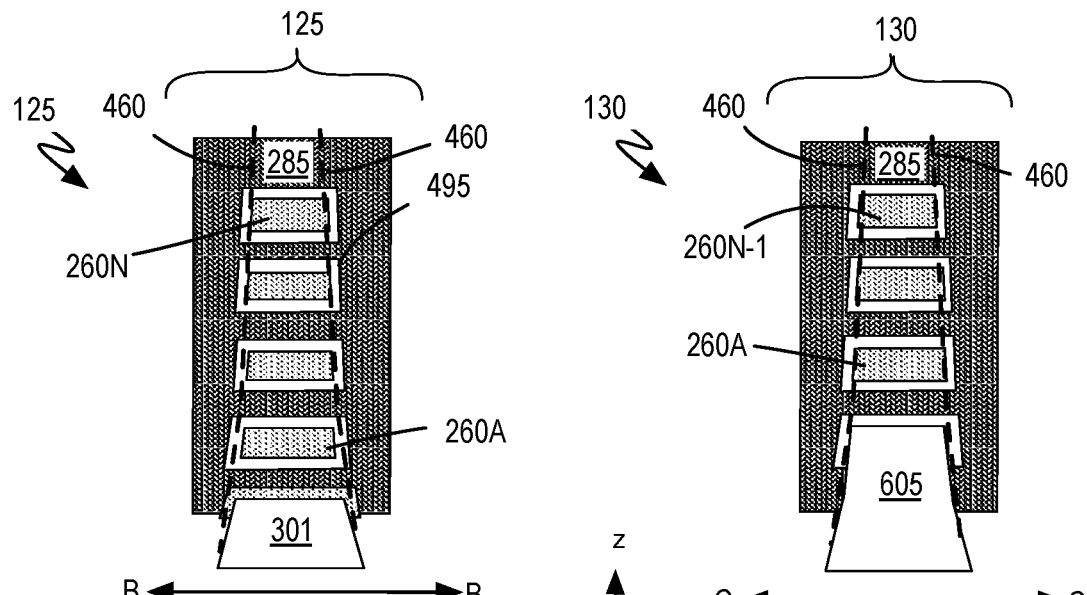
FIG. 7B
FIG. 7C

SRAM WITH CHANNEL COUNT CONTRAST FOR GREATER READ STABILITY

BACKGROUND

Integrated circuit (IC) devices often include static random-access memory (SRAM). Microprocessor chips, for example, dedicate a significant amount of chip area to SRAM arrays as a lowest level cache storing bits for processing by arithmetic logic units (ALUs). An SRAM array includes a plurality of SRAM bit cells. FIG. 1 illustrates a conventional six-transistor (6T) SRAM bit-cell 100 that includes six transistors comprising two p-channel load or "pull-up" transistors 120 and four n-channel transistors that further comprise two drive or "pull-down" transistors 125 and two pass-gate transistors 130.

During operation of bit-cell 100, when a wordline (WL) is driven to a voltage potential, a bitline (BL) is driven to Vcc and bitline bar (BLB) is driven to Vss, inverter node N1 is exposed to BL, which can induce a read disturbance. Accordingly, many SRAM implementations include read assist circuitry (not depicted in FIG. 1) coupled to SRAM bit-cell 100. Such read assist circuitry may have various topologies but is generally operable to lower the WL voltage, and thereby weaken the N1/N2 node exposure to BL/BLB. Such read assist circuitry can occupy significant chip area and reduce SRAM read performance. Accordingly, improvements to an SRAM bit-cell architecture that can reduce the overhead of SRAM read assist circuitry are advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 5A is a longitudinal cross-sectional view through the pull-down and pass-gate transistors shown in FIG. 3, in accordance with some back-side channel inactivation embodiments;

FIG. 5B is a transverse cross-sectional view through a channel region of the pull-down transistor shown in FIG. 3, in accordance with some back-side channel inactivation alternative embodiments;

FIG. 5C is a transverse cross-sectional view through a channel region of the pull-down transistor shown in FIG. 3, in accordance with some back-side channel inactivation alternative embodiments;

FIG. 7A is a longitudinal cross-sectional view through the pull-down and pass-gate transistors shown in FIG. 3, in accordance with some back-side channel removal embodiments;

FIG. 7B is a transverse cross-sectional view through a channel region of the pull-down transistor shown in FIG. 3, in accordance with some back-side channel removal embodiments;

FIG. 7C is a transverse cross-sectional view through a channel region of the pull-down transistor shown in FIG. 3, in accordance with some back-side channel removal embodiments;

DETAILED DESCRIPTION

Figure 1:
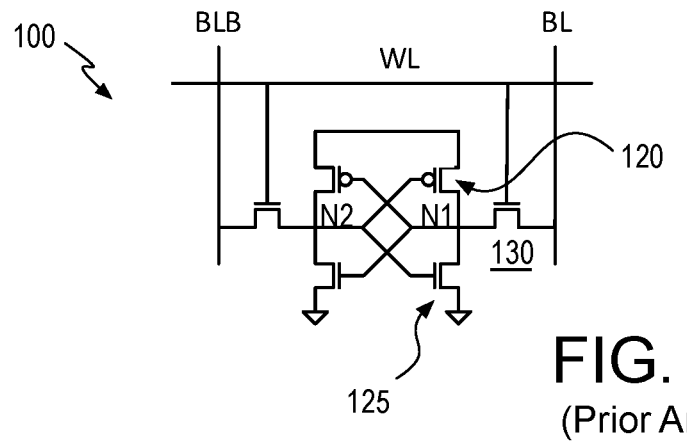
FIG. 1 is a circuit schematic of a conventional 6T-SRAM bit-cell.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any possible combinations of one or more of the associated listed items.

The terms "coupled" and "connected," along with their derivatives, may be used herein to describe functional or structural relationships between components. These terms are not intended as synonyms for each other. Rather, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

In accordance with embodiments herein, integrated circuit (IC) static random-access memory (SRAM) comprises access or pass-gate transistors that have a different number of active channel regions than that of pull-down transistors. For exemplary embodiments where pass-gate transistors have a smaller number of active channels than pull-down transistors, drive current of the pass-gate transistors is reduced relative to that of the pull-down transistors for a reference bit-cell design where pull-down and pass-gate transistor architectures are otherwise substantially identical. Accordingly, read instability of a bit-cell, and/or overhead associated with read assist circuitry that would otherwise be needed to modulate the wordline voltage, may be reduced.

FIG. 2A is a plan view of a 6T-SRAM bit-cell layout 200 with an active channel count contrast, or modulation, between pull-down transistor 125 and pass-gate transistor 130, in accordance with some embodiments. Pull-down transistor 125 includes a larger number of active channel regions 291 within nanoribbons 260. Pass-gate transistor 130 includes a smaller number of active channel regions 292 within nanoribbons 260. In accordance with exemplary embodiments, the larger number of active channel regions 291 exceeds the smaller number of active channel regions 292 by at least one active channel region. However, the larger number of active channel regions 291 may exceed the smaller number of active channel regions 292 by any other integer number (e.g., two, or more).

In the exemplary layout 200, pull-down transistor 125 and pass-gate transistor 130 include separate regions of nanoribbons 260 that are continuous over a length spanning one side of a bit-cell 105. Over this length, nanoribbons 260 have substantially the same transverse width $W_1$ to illustrate advantageous embodiments where area of bit-cell 105 (i.e., cell height) and/or layout complexity is minimized. However, the channel count contrast described herein may be readily applied to SRAM bit-cell layouts other than layout 200. For example, in some other bit-cell layouts, ribbon width and/or threshold voltage may be modulated between pull-down transistor 125 and pass-gate transistor 130 in conjunction with the channel count modulation described in detail below. In contrast to nanoribbon width modulation, which may impact the cell height of bit-cell 105, modulation of channel count has the advantage of being substantially volumeless.

Figure 2:
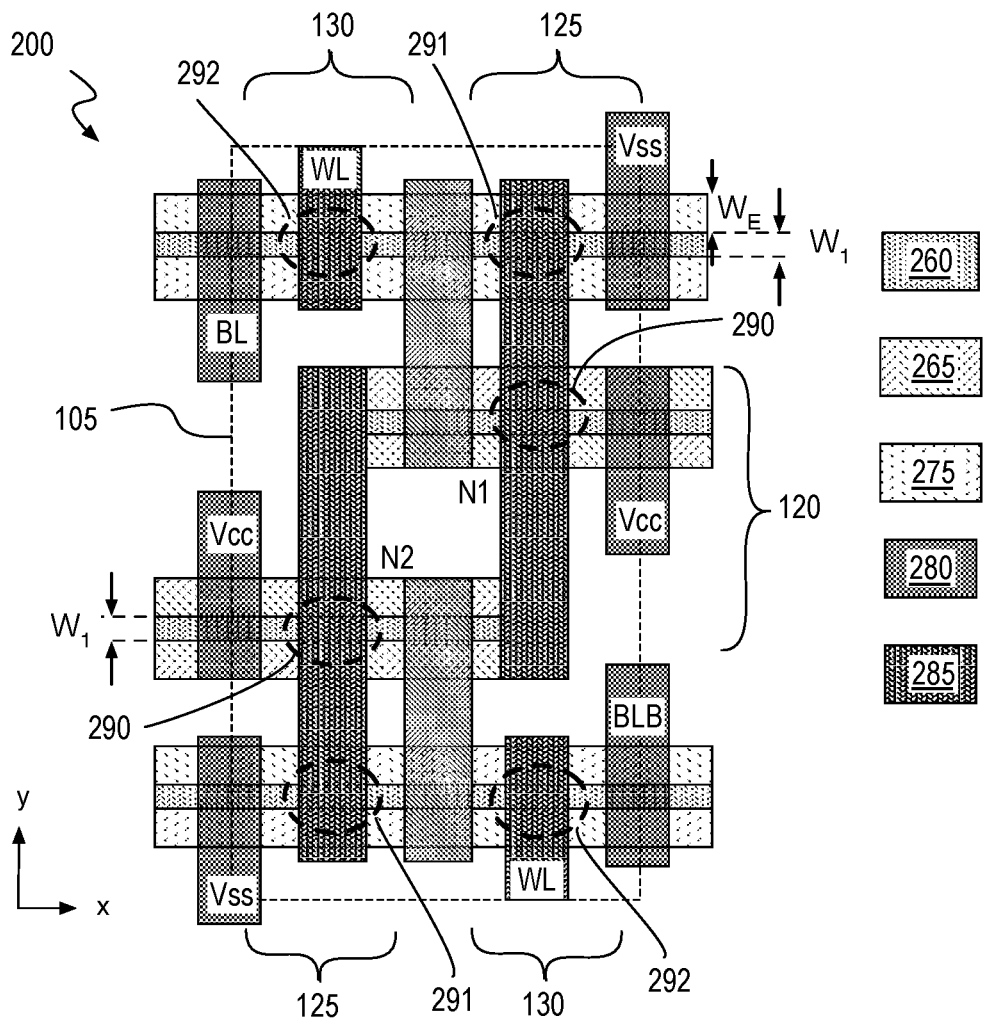
FIG. 2 is a plan view of a 6T-SRAM bit-cell layout with channel count modulation between a pull-down and pass-gate transistors, in accordance with some embodiments.

As further illustrated in FIG. 2, pull-down transistor 125 and pass-gate transistor 130 include impurity doped semiconductor 275 of a first conductivity type (e.g., n-type), which extends an epitaxial width $W_E$ beyond a sidewall of nanoribbons 260. In the exemplary embodiment, epitaxial width $W_E$ is substantially the same for both pull-down transistor 125 and pass-gate transistor 130. A first semiconductor terminal (e.g., source) of pull-down transistor 125 comprising impurity doped semiconductor 275 is coupled to Vss through a contact metallization 280. A first semiconductor terminal (e.g., source) of pass-gate transistor 130 comprising impurity doped semiconductor 275 is coupled to bitline BL through contact metallization 280.

A gate electrode 285 of pull-down transistor 125 is coupled to load/pull-up transistors 120. The gate electrode 285 of pass-gate transistor 130 is coupled to wordline WL. A second semiconductor terminal (e.g., drain) of pull-down transistor 125 is coupled with a second semiconductor terminal (e.g., drain) of pass-gate transistor 130, each of which comprises impurity doped semiconductor 275 that is further coupled through contact metallization 280 to one of the pull-up transistors 120.

Bit-cell 105 includes a second pull-down transistor 125 that comprises a portion of another stack of nanoribbons 260 with the larger number of active channel regions 291. Another pass-gate transistor 130 having the smaller number of active channel regions 292 couples an output of the inverters to a bitline bar BLB. This second instance of pass-gate transistor 130 comprises another portion of the stack of nanoribbons 260, which is coupled to another wordline WL. In some examples where pass-gate transistors 130 and pull-down transistors 125 are both n-type/n-channel devices, pull-up transistors 120 are p-type/p-channel transistors comprising impurity-doped semiconductor material 265 of a second conductivity type (e.g., p-type). Transistors 120 and 130 form two cross-coupled inverters where the output of one inverter is the input to the other inverter.

Pull-up transistors 120 comprise nanoribbons 260, also of a ribbon width $W_1$. Pull-up transistor ribbon width may however also vary with implementation. For example, pull-up transistor ribbon width may be greater or smaller than either pull-down transistor ribbon width or pass-gate transistor ribbon width. Pull-up transistors 120 may also have any threshold voltage, equal to or different from the threshold voltage of pull-down transistors 125 and/or pass-gate transistors 130. Pull-up transistors 120 may also comprise any number of active channel regions 290. Pull-up transistors 120 may therefore have more than either the larger number of active channel regions 291 or the smaller number of active channel regions 291, or may have fewer than either the larger number of active channel regions 291 or the smaller number of active channel regions 291.

In some embodiments where the drive strength of pull-up transistors 120 is less than that of pull-down transistors 125, the number of active channel regions 290 is no more than the smaller number of active channel regions 292. In other embodiments, the number of active channel regions 290 is equal to the larger number of active channel regions 291 so that the drive strength of pull-up transistors 120 is greater than that of pass-gate transistors 130. In still other embodiments, the number of active channel regions 290 is greater than the larger number of active channel regions 291 so that the drive strength of pull-up transistors 120 is greater than that of both pull-down transistors 125 and pass-gate transistors 130.

Figure 3:
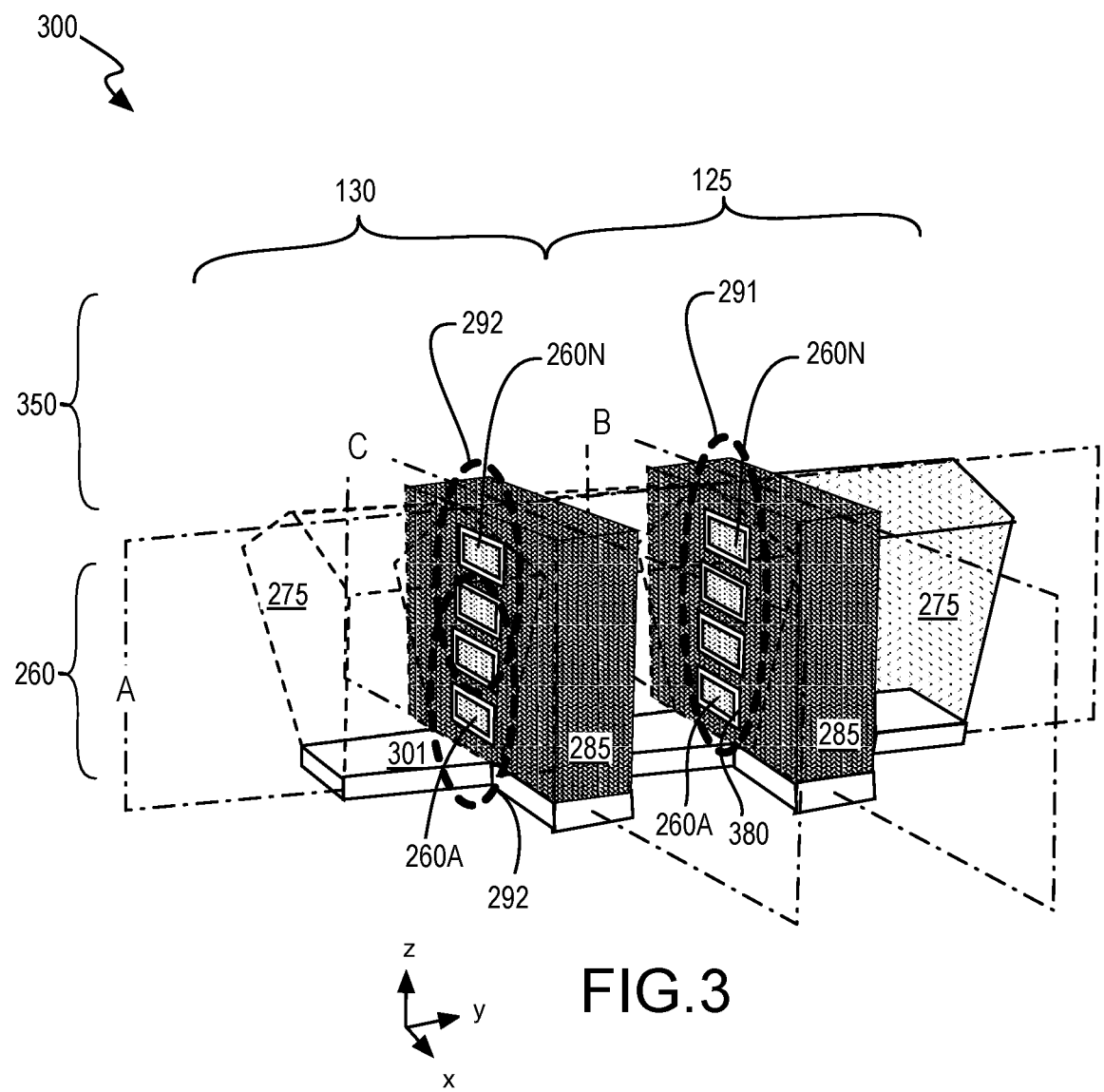
FIG. 3 is an isometric sectional view further illustrating pull-down and pass-gate transistors having a different number of channel regions, in accordance with some nanoribbon embodiments.

FIG. 3 is an isometric sectional view of an SRAM structure portion 300 further illustrating an active channel count contrast between pull-down and pass-gate transistors 125, 130, in accordance with some nanoribbon embodiments. The features illustrated in FIG. 3 may be present in any of the embodiments illustrated in FIG. 2, for example. Likewise, the features illustrated in FIG. 2 may be present in any of the embodiments illustrated in FIG. 3.

As shown in FIG. 3, transistors 125 and 130 each have a stacked, gate-all-around transistor architecture. Nanoribbons 260 include an uppermost nanoribbon 260N stacked in vertical alignment with a lowermost nanoribbon 260A. The exemplary ribbon-or-wire (RoW) transistor stack structure is illustrated as including four nanoribbons, but such a transistor stack structure may include any integer number of channel regions (e.g., 2, 3, 4, 5 . . . 10 . . . 20, etc.) as embodiments herein are not limited in this respect.

Within pull-down transistor 125, the larger number of active channel regions 291 includes a channel region corresponding to each of nanoribbons 260A-260N. Each of the larger number of active channel regions 291 are surrounded by a gate stack that includes a gate insulator 380 and gate electrode 285. Impurity-doped semiconductor 275 is at terminal ends of the larger number of active channel regions 291, on opposite sides of the gate stack. In contrast, pass-gate transistor 130 includes the smaller number of active channel regions 292. As denoted by the two overlapping dashed line ellipses, the smaller number of active channel regions 292 excludes at least bottom nanoribbon 260A or at least top nanoribbon 260N. In reference to a front-side metallization level 350, an absent or inactivated channel region associated with top nanoribbon 260N is between front-side metallization level 350 and the smaller number of active channel regions 292 if channel region of nanoribbon 260N is inactivated or removed. Alternatively, the smaller number of active channel regions 292 may between front-side metallization level 350 and an absent or inactivated channel region associated with bottom nanoribbon 260A.

The smaller number of active channel regions 292 may be a lowermost or uppermost subset of the larger number of active channel regions 291. The cross-sectional channel area for each channel is a function of ribbon thickness (e.g., z-dimension) and ribbon width (e.g., x-dimension), which are both substantially the same in some exemplary embodiments. For each of transistors 125 and 130, nanoribbons 260 are coupled together in electrical parallel and a difference in cumulative cross-sectional channel area is primarily a function the different numbers of active channel regions.

In some embodiments, nanoribbons 260 are crystalline semiconductor. Although the crystalline semiconductor includes polycrystalline thin film material, the crystalline semiconductor may be advantageously substantially monocrystalline. In some such embodiments, the crystallinity of nanoribbons 260 is cubic with the top surfaces having crystallographic orientation of (100), (111), or (110), for example. Other crystallographic orientations are also possible. In some embodiments, nanoribbons 260 are a substantially monocrystalline group IV semiconductor material, such as, but not limited to substantially pure silicon (e.g., having only trace impurities), silicon alloys (e.g., SiGe), germanium alloys (GeSn), or substantially pure germanium (e.g., having only trace impurities).

Nanoribbons 260 may also have any of these same exemplary compositions in alternative polycrystalline or amorphous embodiments, for example where the stack of nanoribbons 260A-260N has been fabricated from a stack of thin film semiconductor material layers. Polycrystalline or amorphous embodiments of nanoribbons 260 may also include semiconducting metal oxides, such as IGZO.

Although nanoribbons 260 are illustrated as having a substantially homogenous composition, they may alternatively comprise one or more semiconductor heterojunctions that, for example further include a first semiconductor material adjacent to a second semiconductor material.

Sub-channel material 301 is under the stack of nanoribbons 260. Sub-channel material 301 may have any composition and/or microstructure. For example, in some embodiments where nanoribbons 260 are of a Group IV material (e.g., silicon), sub-channel material 301 is also a Group IV material (e.g., silicon). In some further embodiments where nanoribbons 260 are substantially monocrystalline, sub-channel material 301 is also substantially monocrystalline, and has the same crystallinity and/or crystal orientation as that of nanoribbons 260. In alternative embodiments, sub-channel material 301 is a buried insulator layer (e.g., $SiO_2$), for example of a semiconductor-on-insulator (SOI) substrate.

Impurity doped semiconductor 275 is electrically and physically coupled to opposite sides of channel regions of nanoribbons 260A-260N. In this example, impurity doped semiconductor 275 comprises faceted epitaxial material that has been grown, for example laterally from an end portion of channel regions, and/or from cantilevered source/drain ends of nanoribbons 260A-260N, and/or from sub-channel material 301. Impurity doped semiconductor 275 need not be epitaxial material, in which case the facets shown in FIG. 3 may not be present. Impurity doped semiconductor 275 also need not merge into a unitary body, in which case cantilevered source/drain nanowire ends may be individually in contact with contact metallization 280.

Impurity-doped semiconductor 275 may comprise one or more electrically active impurities. In some embodiments, for example, impurity-doped semiconductor 275 is a Group IV semiconductor material (e.g., Si, Ge, SiGe or GeSn alloy). For exemplary embodiments where pull-down and pass-gate transistors 125 and 130 are both NMOS, impurity doped semiconductor 275 comprises an n-type impurity such as phosphorus, arsenic, or antimony.

Gate insulator 380 may have any composition. Gate insulator 380 may include any number of material layers. In some exemplary embodiments, gate insulator 380 includes a thermal (chemical) oxide in addition to a high-k material. The chemical oxide may be present only on interfaces with channel regions of nanoribbons 260. In some embodiments where nanoribbons are substantially pure silicon, the chemical oxide layer comprises predominantly silicon and oxygen. The high-k material composition(s) may be any known to be suitable for a transistor gate insulator and that has a bulk relative permittivity greater than 8. One exemplary high-k material has a composition of $M1O_x$ where M1 is a transition or rare earth metal. Examples include a metal oxide comprising predominantly hafnium (e.g., $HfO_x$), a metal oxide comprising predominantly aluminum (e.g., $AlO_x$), a metal oxide comprising predominantly magnesium (e.g., MgO), a metal oxide comprising predominantly lanthanum (e.g., $LaO_x$), or a metal oxide comprising predominantly zirconium (e.g., $ZrO_x$) In other examples, the high-k material is an alloyed metal oxide comprising primarily two or more metals (e.g., $HfAlO_x$, $HfZrO_x$) In some further embodiments, the high-k material further includes silicon. For example, metal silicates, such as, but not limited to $HfSiO_x$, or $ZrSiO_x$, may also be suitable a high-k material.

Gate electrode 285 co-axially clads the insulator-clad channel regions of nanoribbons 260 to provide gate-all-around control of channel conductivity. Gate electrode 285 may include any suitable workfunction metal, such as n-type workfunction metal, and is advantageously substantially the same for both pull-down transistor 125 and pass-gate transistor 130. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide).

In exemplary embodiments, inactivation or removal of a channel region (e.g., associated with either nanoribbon 260A or 260N) accordingly reduces the number of channel regions pass-gate transistor 130 would otherwise have (e.g., further including nanoribbon 260A and 260N). Hence, rather than pass-gate transistor 130 having the larger number of active channel regions 291 found in pull-down transistor 125, pass-gate transistor 130 has only a sub-set of those active channel regions. As described further below, within pass-gate transistor 130 the excluded bottom nanoribbon 260A or top nanoribbon 260N may be either substantially replaced with a dielectric material, or impurity doped into an inactive channel region, for example having a conductivity type complementary to that of impurity-doped semiconductor 275. For the illustrated embodiment where individual ones of the smaller number of active channel regions 292 are substantially colinear with corresponding ones of the larger number of active channel regions 291, the inactive channel region or substituted dielectric material is co-planar with one of the larger number of active channel regions 291.

In FIG. 3, planes A, B C are demarked by dashed lines. Plane A is a "gate-cut" plane that passes through a transverse width of gate electrode 285 and through a longitudinal length of nanoribbons 260. Plane B is a "ribbon-cut" plane that passes through a transverse width of nanoribbons 260 and through a longitudinal length of gate electrode 285 of pull-down transistor 125. Plane C is a another "ribbon-cut" plane that passes through a transverse width of nanoribbons 260 and through a longitudinal length of gate electrode 285 of pass-gate transistor 130.

Figure 4A:
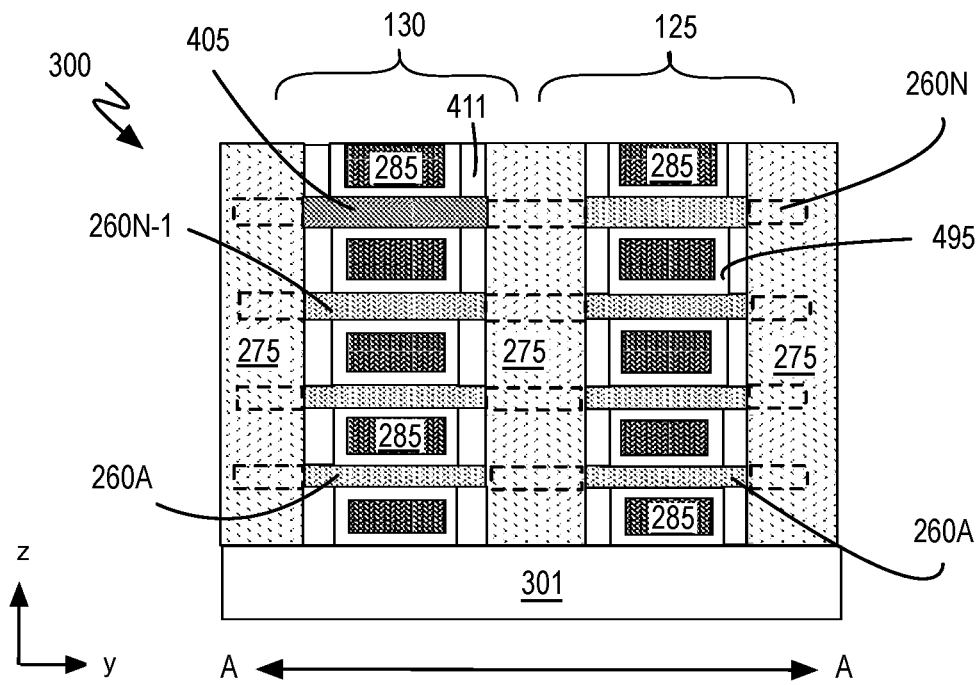
FIG. 4A is a longitudinal cross-sectional view through the pull-down and pass-gate transistors shown in FIG. 3, in accordance with some front-side channel inactivation embodiments.
Figures 4B, 4C:
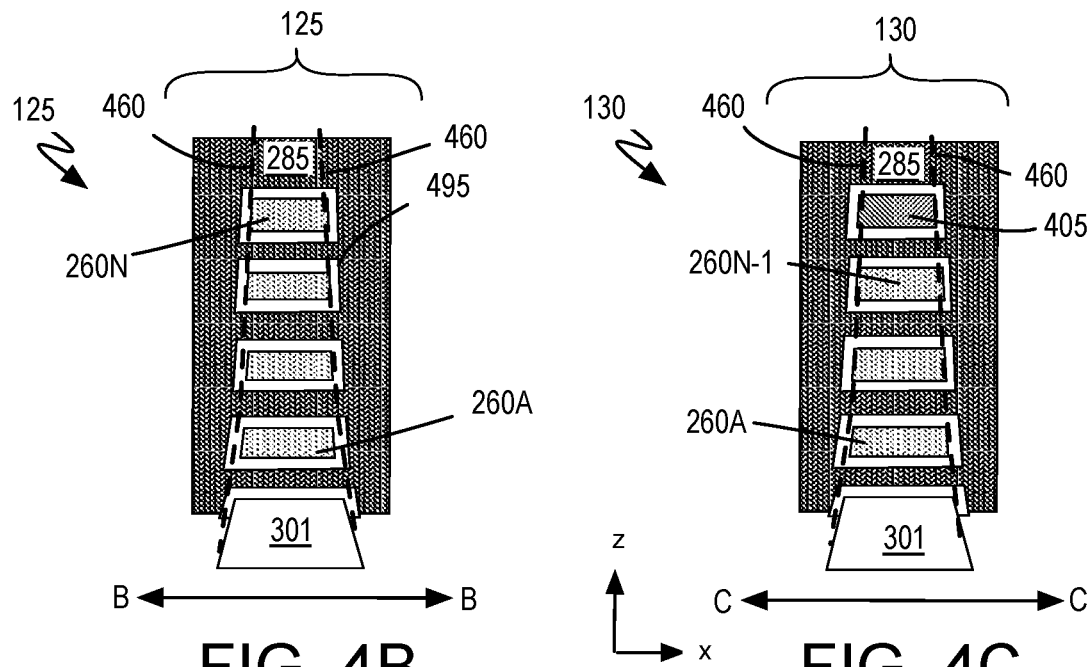
FIG. 4B is a transverse cross-sectional view through a channel region of the pass-gate transistor shown in FIG. 3, in accordance with some front-side channel inactivation embodiments.
FIG. 4C is a transverse cross-sectional view through a channel region of the pull-down transistor shown in FIG. 3, in accordance with some front-side channel inactivation embodiments.

FIG. 4A illustrates a cross-sectional view of transistors 125, 130 along the A plane introduced in FIG. 3, in accordance with some front-side channel inactivation embodiments. FIG. 4B illustrates a cross-sectional view of pull-down transistor 125 along the B plane introduced in FIG. 3, in accordance with some embodiments. FIG. 4C illustrates a cross-sectional view of pass-gate transistor 130 along the C plane introduced in FIG. 3, in accordance with some embodiments. FIG. 4A-4C illustrate exemplary embodiments where a channel region of an uppermost nanoribbon is inactivated or rendered substantially inoperable for transport of majority charge carriers.

Referring first to FIG. 4A, nanoribbons 260 are bodies of semiconductor material that extend through channel regions of both transistors 125 and 130. Gate electrode 285 clads gate insulator 495 along the pull-down and pass-gate channel lengths. Gate insulator 495 further clads channel regions of nanoribbons 260. In this example, nanoribbons 260 also extend through a dielectric spacer 411. In some embodiments, nanoribbons 260 may also extend through impurity-doped semiconductor 275 as denoted by dashed lines in FIG. 4A. In alternative embodiments, nanoribbons 260 may be completely absent beyond dielectric spacer 411 with impurity-doped semiconductor 275 then being a unitary body intervening between two separate stacks of nanoribbons 260.

As further shown in FIG. 4A, pass-gate transistor 130 lacks at least one active top channel region that is coplanar with a top channel region in pull-down transistor 125 that is part of nanoribbon 260N. Pull-down transistor 125 has the full complement of active channel regions, while pass-gate transistor 130 includes an electrically inactive channel region 405.

In some embodiments, inactive channel region 405 has a greater concentration of impurities that render inactive channel region 405 substantially inoperable for charge carrier transport between source and drain terminals that comprise impurity-doped semiconductor 275. Except for the greater impurity concentration, inactive channel region 405 may be substantially the same material as nanoribbons 260A-260N. For example, where channel regions of nanoribbons 260A-260N are a Group IV semiconductor material (e.g., predominantly silicon), inactive channel region 405 may also be the Group IV semiconductor material, but is impurity doped into an inactive channel region 405 in an "off" state under all gate bias voltages that pass-gate transistor 130 may experience during SRAM bit-cell operation.

In some embodiments, inactive channel region 405 includes an electrically active impurity associated with a conductivity type complementary to impurity-doped semiconductor 275. For example, where pass-gate transistor structure 130 is an n-type (NMOS) device and impurity-doped semiconductor 275 has n-type conductivity, inactive channel region 405 is doped p-type. Such complementary doping may provide junction isolation with impurity-doped semiconductor 275. Suitable impurities for an inactive p-type silicon channel material include, but are not limited to, boron or gallium. For alternative embodiments where pull-down transistor 125 and pass-gate transistor 130 are instead p-type devices, inactive silicon channel material may be doped with n-type impurities such as phosphorus, arsenic, or antimony.

Although the impurity concentration level may vary widely, in some exemplary embodiments, inactive channel region 405 has an impurity concentration in excess of 1e19 atoms/cm$^3$ (e.g., approximately 1e20 atoms/cm3, or more). In the illustrated embodiment, substantially the entire channel length is impurity doped into inactive channel region 405. For such embodiments, a co-planar portion of impurity-doped semiconductor 275 may also be counter-doped with the same impurity present within inactive channel region impurity doped into inactive channel region 405.

Significant concentrations of the impurity present within inactive channel region 405 may be advantageously limited to inactive channel region 405 while active channel regions associated with nanoribbons 260A-260N−1 remain operable. In exemplary embodiments, the concentration of the impurity within inactive channel region 405 is at least two orders of magnitude lower within active channel regions of nanoribbons 260A-260N−1, and may be advantageously three orders of magnitude lower, or less. Hence, active channel regions of nanoribbons 260A-260N−1 (as well as active channel regions within pull-down transistor 125) may be substantially undoped by the impurity present within inactive channel region 405. A steep impurity gradient along the z-dimension in FIG. 4A may therefore be present within pass-gate transistor 130 with no such impurity gradient within pull-down transistor 125.

In some embodiments where nanoribbons 260A-260N are substantially monocrystalline, inactive channel region 405 is also substantially monocrystalline, and has the same crystallinity and/or crystal orientation as that of nanoribbons 260A-260N. However, in other embodiments, inactive channel region 405 has a lower degree of crystallinity than active channel regions of nanoribbons 260A-260N−1. In addition to being more amorphous, inactive channel region 405 may include one or more amorphizing impurities, such as silicon or germanium. For some embodiments where nanoribbons 260A-260N comprise predominantly silicon, the presence of germanium within inactive channel region 405 is indicative of a targeted amorphization. For other embodiments where nanoribbons 260A-260N comprise predominantly germanium, the presence of silicon within inactive channel region 405 is likewise indicative of a targeted amorphization. Such impurities within a majority Group IV semiconductor may impart significant lattice damage that reduces the crystallinity of inactive channel region 405 below that of nanoribbons 260A-260N because amorphizing impurities are advantageously substantially absent from nanoribbons 260A-260N. So, in addition to greater crystallinity, active channel regions may have a much lower amorphizing impurity concentration than inactive channel region 405.

As further shown in FIG. 4B and FIG. 4C, nanoribbons 260 may have been patterned from a fin of a substrate material layer, for example having the dashed nanoribbon sidewalls 460. The slightly positive slope of sidewalls 460 results in each of nanoribbons 260A-260N having a trapezoidal slab profile representative of structural asymmetry associated with front-side transistor fabrication. Such asymmetry may be a result of nanoribbon sidewall 460 evolving during subtractive patterning of a fin into a stack of semiconductor materials, for example. Although nanoribbons 260 are illustrated as having a transverse (x) width greater than their vertical thickness, nanoribbons 260 may instead have a vertical (z) thickness greater than, or substantially equal to, their transverse width.

FIG. 5A illustrates a cross-sectional view of transistors 125, 130 along the A plane introduced in FIG. 3, in accordance with some back-side channel inactivation embodiments. FIG. 5B illustrates a cross-sectional view of pull-down transistor 125 along the B plane introduced in FIG. 3, in accordance with some embodiments. FIG. 5C illustrates a cross-sectional view of pass-gate transistor 130 along the C plane introduced in FIG. 3, in accordance with some embodiments. FIG. 5A-5C illustrate exemplary embodiments where a channel region of a lowermost nanoribbon is inactivated or rendered substantially inoperable for transport of majority charge carriers. In FIG. 5A-5C, reference numbers are retained for features that may have any of the same properties described above in the context of FIG. 2-4C.

In FIG. 5A-5C pass-gate transistor 130 lacks at least one active bottom channel region that is coplanar with a bottom channel region in pull down transistor 125 associated with nanoribbon 260A. Pull-down transistor 125 has the full complement of active channel regions, while pass-gate transistor 130 again includes an electrically inactive channel region 405. Aside from it position within the stack of nanoribbons, inactive channel region 405 may have any of the properties described above.

Figure 6A:
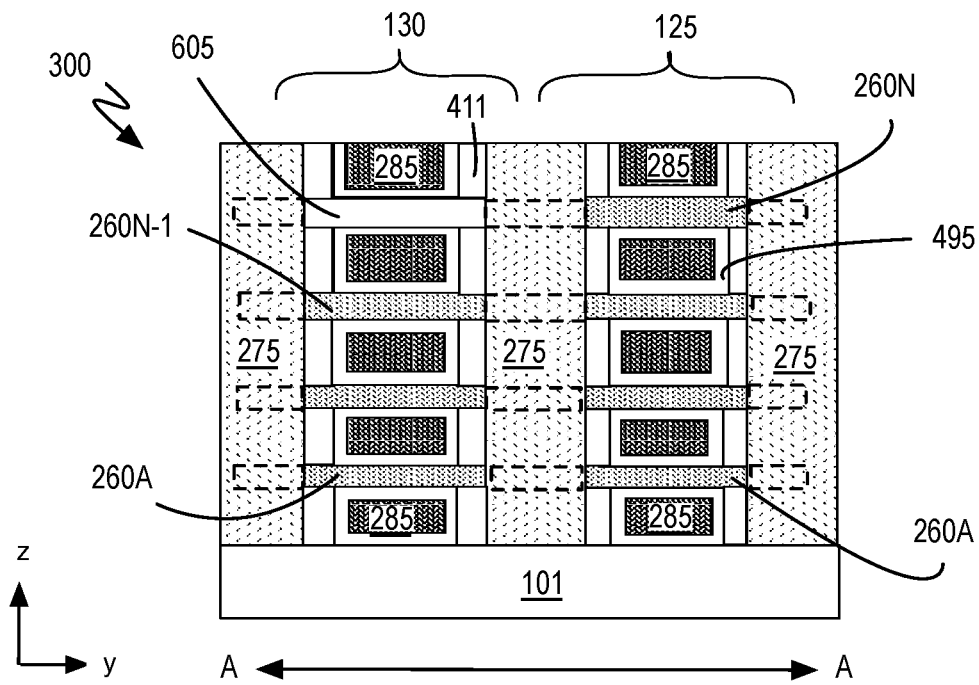
FIG. 6A is a longitudinal cross-sectional view through the pull-down and pass-gate transistors shown in FIG. 3, in accordance with some front-side channel removal embodiments.
Figures 6B, 6C:
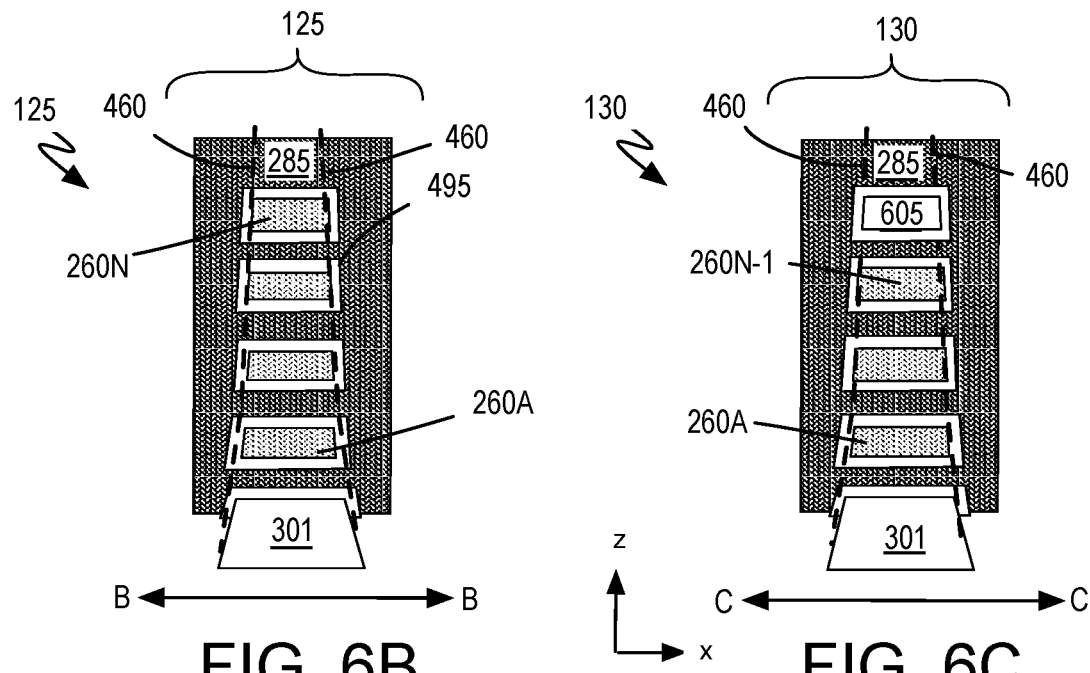
FIG. 6B is a transverse cross-sectional view through a channel region of the pull-down transistor shown in FIG. 3, in accordance with some front-side channel removal embodiments.
FIG. 6C is a transverse cross-sectional view through a channel region of the pull-down transistor shown in FIG. 3, in accordance with some front-side channel removal embodiments.

FIG. 6A illustrates a cross-sectional view of transistors 125, 130 along the A plane introduced in FIG. 3, in accordance with some front-side channel replacement embodiments. FIG. 6B illustrates a cross-sectional view of pull-down transistor 125 along the B plane introduced in FIG. 3, in accordance with some embodiments. FIG. 6C illustrates a cross-sectional view of pass-gate transistor 130 along the C plane introduced in FIG. 3, in accordance with some embodiments. FIG. 6A-6C illustrate exemplary embodiments where a channel region of an uppermost nanoribbon is removed and replaced with an electrically insulative amorphous material. In FIG. 6A-6C, reference numbers are retained for features that may have any of the same properties described above in the context of FIG. 2-5C.

As shown in FIG. 6A-6C pass-gate transistor 130 that lacks at least one upper channel region that is present within pull-down transistor 125. In the illustrated example, pull-down transistor 125 has four channel regions whereas pass-gate transistor 130 has only three channel regions with an amorphous material 605 in place of an active channel region associated with nanoribbon 260N. As shown in FIG. 6A, amorphous material 605 is coplanar with nanoribbon 260N. Although pass-gate transistor 130 is illustrated with amorphous material 605 replacing only one channel region, any number active channel regions may be similarly replaced with amorphous material 605.

Amorphous material 605 is compositionally distinct from nanoribbons 260A-260N and may be any material that is inoperable as a channel material, at least under the gate bias voltages at which pass-gate transistor 130 is biased during SRAM bit-cell operation. In some exemplary embodiments, amorphous material 605 is a dielectric material. Suitable dielectric materials include, but are not limited to, silicon dioxide, a low-k dielectric (e.g., SiOC), silicon oxynitride, silicon nitride, or an even high-k dielectric (e.g., metal oxide).

FIG. 7A illustrates a cross-sectional view of transistors 125, 130 along the A plane introduced in FIG. 3, in accordance with some back-side channel removal/replacement embodiments. FIG. 7B illustrates a cross-sectional view of pull-down transistor 125 along the B plane introduced in FIG. 3, in accordance with some embodiments. FIG. 5C illustrates a cross-sectional view of pass-gate transistor 130 along the C plane introduced in FIG. 3, in accordance with some embodiments. FIG. 7A-7C illustrate exemplary embodiments where a channel region of a lowermost nanoribbon is removed and replaced with an electrically insulative amorphous material. In FIG. 7A-7C, reference numbers are retained for features that may have any of the same properties described above in the context of FIG. 2-6C.

In FIG. 7A-7C pass-gate transistor 130 lacks at least one active bottom channel region that is coplanar with a bottom channel region in pull down transistor 125 associated with nanoribbon 260A. Aside from its position within the stack of nanoribbons, electrically insulative amorphous material 605 may have any of the properties described above in the context of FIG. 6A-7C.

Figure 8:
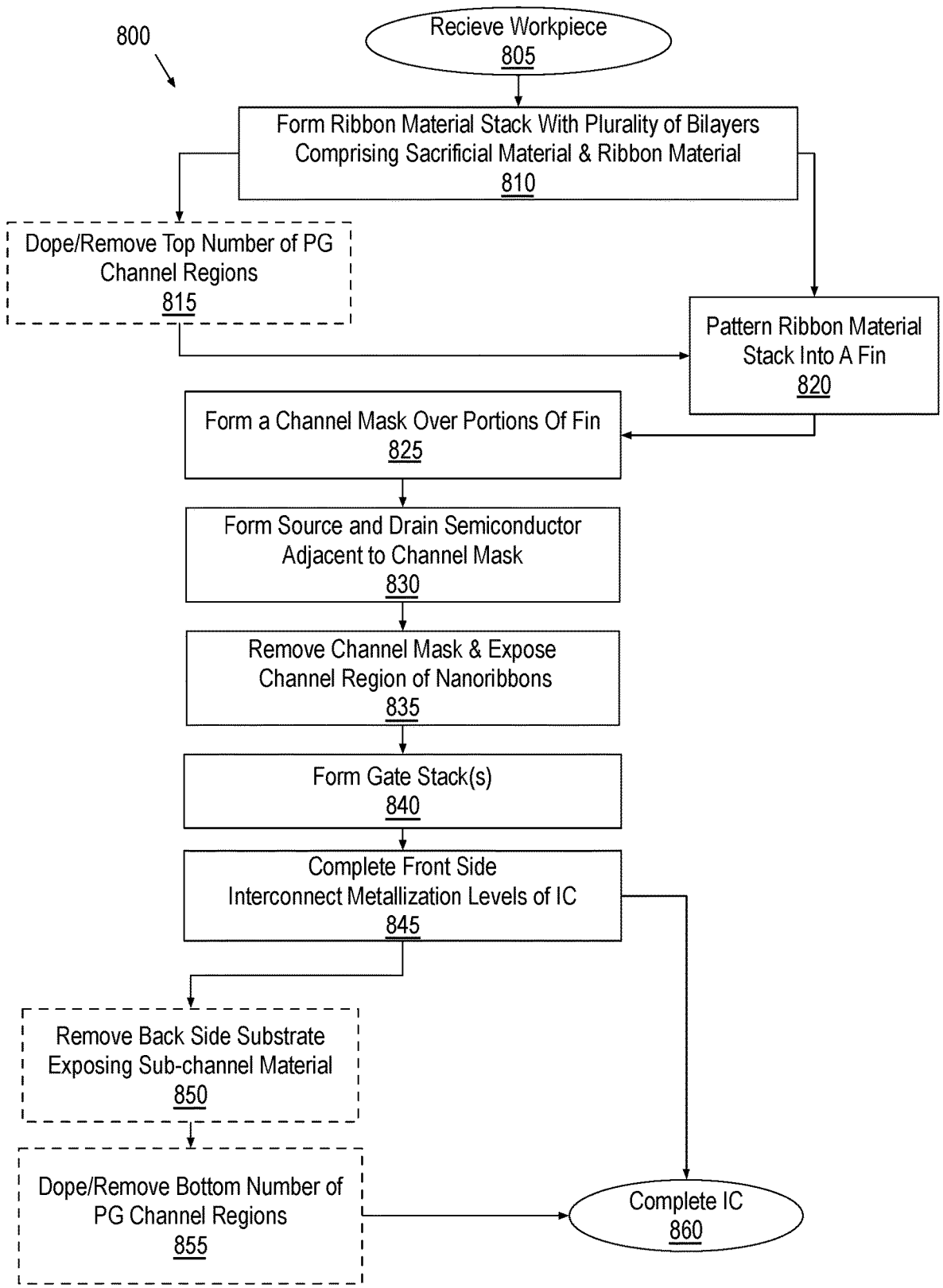
FIG. 8 is a flow diagram illustrating a method of fabricating an SRAM bit-cell with channel count contrast, in accordance with some embodiments.

The active channel count contrast between pull-down and pass-gate transistors described above may be implemented through either front-side or back-side processing, or both. FIG. 8 is a flow diagram of methods 800 for fabricating an SRAM bit-cell with contrasting active channel count, in accordance with some embodiments. Methods 800 may be practiced to form one or more of the SRAM transistor structures illustrated in FIG. 2-7C, for example.

Methods 800 begin at input 805 where a workpiece is received. In some embodiments, the workpiece received at input 805 is a wafer suitable for IC die fabrication. The workpiece may, for example, further include part of a workpiece substrate (e.g., a large format semiconductor wafer) that is to become an IC chip. At block 810, a nanoribbon material stack is formed. The nanoribbon material stack may advantageously include a plurality of bilayers comprising a sacrificial material and ribbon material. In some embodiments, the sacrificial material layers include more germanium than the ribbon material. For example, where the ribbon material is predominantly silicon, the sacrificial layers are $Si_{1-x}Ge_x$.

Optionally, methods 800 continue at block 815 where a pass-gate transistor region of the nanoribbon material stack is defined, for example with any suitable mask material. Within the pass-gate transistor region, one or more layer of the ribbon material is either doped with an impurity or removed with a suitable etch process and backfilled with an electrically insulative amorphous material.

In some exemplary embodiments, one or more implant processes are performed at block 815 to implant one or more impurities into some of the layers of ribbon material within the pass-gate transistor region. In some embodiments, an amorphization implant is performed from the front side of the workpiece so that the species is implanted through a depth of the pass-gate transistor region to come to rest within one or more of the upper channel regions that are to be electrically deactivated. Additionally, or in the alternative, one or more impurities that can be electrically activated may be similarly implanted from the from side of the IC workpiece so that the impurity similarly comes to rest within one or more of the upper channel regions that are to be electrically inactivated. The energy of the implantation process(es) may be chosen to isolate a majority of the dopant species within the topmost layer of ribbon material with the pass-gate transistor region. In some embodiments, impurities are implanted with an energy in the range of 1-2 keV. However, a higher energy may be employed to increase impurity concentrations deeper into the IC workpiece, for example within additional layers of ribbon material. Following the impurity implant, a short (flash) activation anneal may be performed to electrically activate some percentage of the impurities implanted that is sufficient render the ribbon material inactive.

In some other exemplary embodiments, one or more etch processes are practiced at block 815 to etch through at least one layer of ribbon material within the pass-gate transistor region. Following the etch process(es), any suitable dielectric material may be deposited into a region from which the ribbon material was removed, and planarized over a remainder of the workpiece.

Methods 800 continue at block 820 where the ribbon material stack is patterned into one or more fins within the pass-gate transistor region and a region where the pull-down transistor will be fabricated. Any patterning process, such as an extreme ultraviolet (EUV) lithography process, may be practiced at block 820 to define a fin mask. Any subtractive etch may be practiced at block 820 to delineate features (e.g., fins) into the nanoribbon material stack. In some embodiments, a plasma etch process may be utilized to define such features.

At block 825, channel portions of the features patterned at block 820 are protected with a channel mask. In some embodiments, the channel mask formed over exposed portions of the fin includes a sacrificial gate stack. At block 830, source and drain regions are formed adjacent to the channel mask, for example by epitaxially growing impurity-doped semiconductor with a low-pressure CVD (LPCVD) process. In exemplary embodiments where pull-down and pass-gate transistors a N-channel devices, source and drain regions grown at block 830 may include predominantly silicon, and one or more n-dopants such as phosphorus, arsenic, or antimony.

At block 835, the channel mask and sacrificial material is removed to expose channel regions of the nanoribbons. At block 840 a gate stack including a gate insulator and a gate electrode is formed around the exposed channel regions within each of the pull-down and pass-gate transistor regions. At block 845 any number of levels of front-side interconnect metallization may be fabricated according to any back-end-of-line (BEOL) processes known to be suitable for integrated circuits (ICs).

Optionally, methods 800 continue with back-side processing at block 850 where a back-side substrate is removed from the workpiece. In some examples, at least a portion of a donor substrate is removed exposing a back (bottom) side of at least the pass-gate transistor region. Removal of the donor substrate may entail a polish (e.g., CMP) and/or a wet or dry (e.g., plasma) etch process. A substantial portion of a donor substrate thickness may also be removed with a cleaving or fracture process.

Once a sufficient amount of the back-side substrate material has been removed, methods 800 may optionally proceed to block 855 where one or more lowermost channel region of a nanoribbon is either doped with an impurity implanted from the back side, or removed with a suitable back-side etch process. An electrically insulative dielectric material may be deposited into any resulting back-side recess. Methods 800 then end at output 860 where any known fabrication techniques may be practiced to complete an IC including SRAM.

Figure 9:
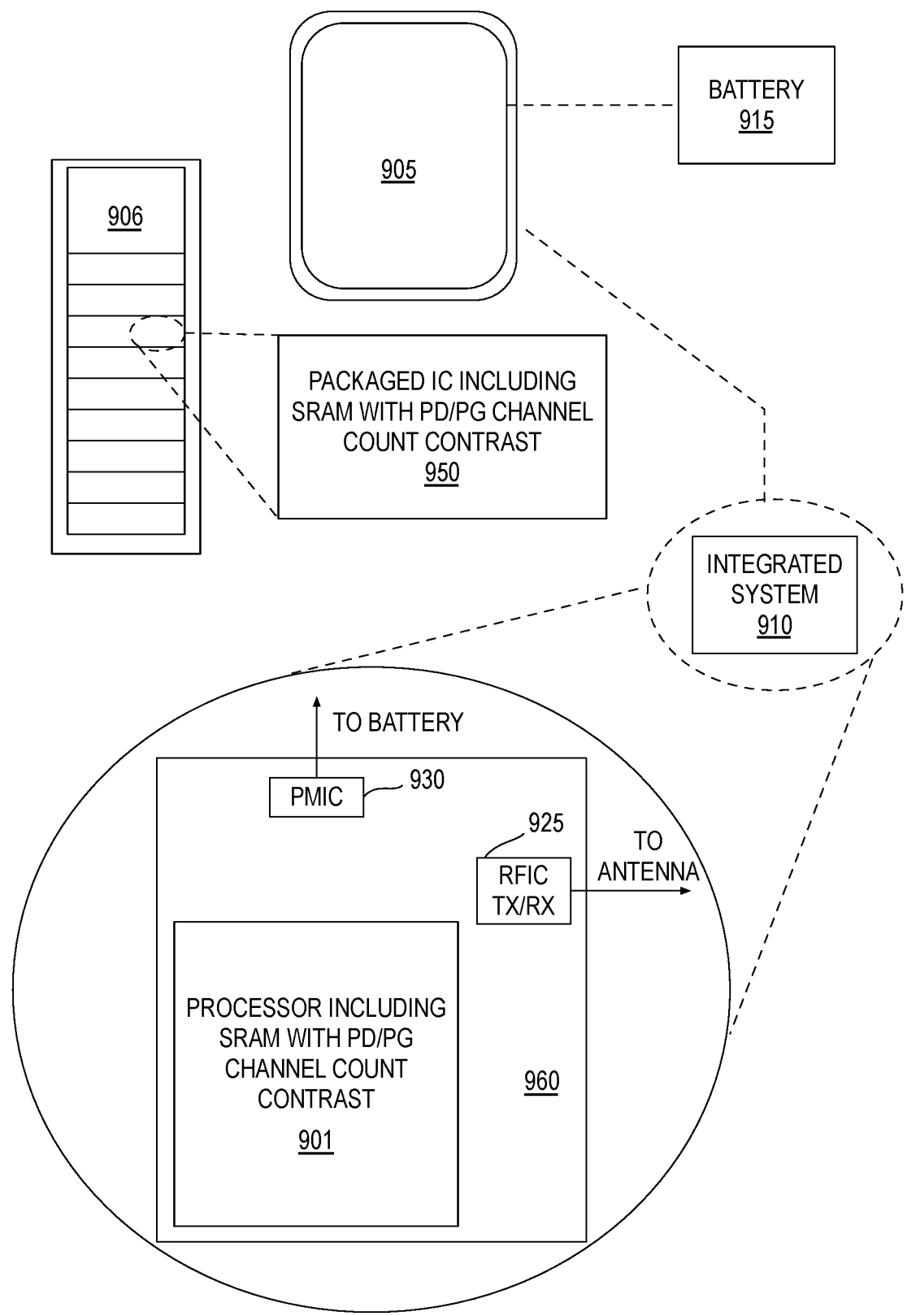
FIG. 9 illustrates a mobile computing platform and a data server machine employing an IC that includes an SRAM with channel count contrast, in accordance with some embodiments.

SRAM bit-cells with pull-down and pass-gate transistors having an active channel count contrast may be integrated into a wide variety of ICs and computing systems that include such ICs. FIG. 9 illustrates a mobile computing platform 905 and a data server computing platform 906 employing a packaged IC including an SRAM having a channel count contrast between the pull-down and pass-gate transistors, for example substantially as described elsewhere herein. The server platform 906 may be any commercial server, for example including any number of high-performance computing platforms disposed within a rack and networked together for electronic data processing, which in the exemplary embodiment includes a packaged IC 950 including an SRAM with a channel count contrast between the pull-down and pass-gate transistors, for example substantially as described elsewhere herein.

The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915. At least one IC of chip-level or package-level integrated system 910 includes a packaged IC with an SRAM that has a channel count contrast between the pull-down and pass-gate transistors, for example substantially as described elsewhere herein.

In the example shown in the expanded view, integrated system 910 includes a microprocessor 901 that includes an SRAM with a channel count contrast between the pull-down and pass-gate transistors, for example substantially as described elsewhere herein. Microprocessor 901 may be further coupled to a host substrate 960. One or more of a power management integrated circuit (PMIC) 930 or an RF (wireless) integrated circuit (RFIC) 925 including a wideband RF (wireless) transmitter and/or receiver (TX/RX) may be further coupled to host substrate 960.

Functionally, PMIC 930 may perform battery power regulation, DC-to-DC conversion, etc., and so has an input coupled to battery 915 and with an output providing a current supply to other functional modules (e.g., microprocessor 901). As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 4G, 5G, and beyond.

Figure 10:
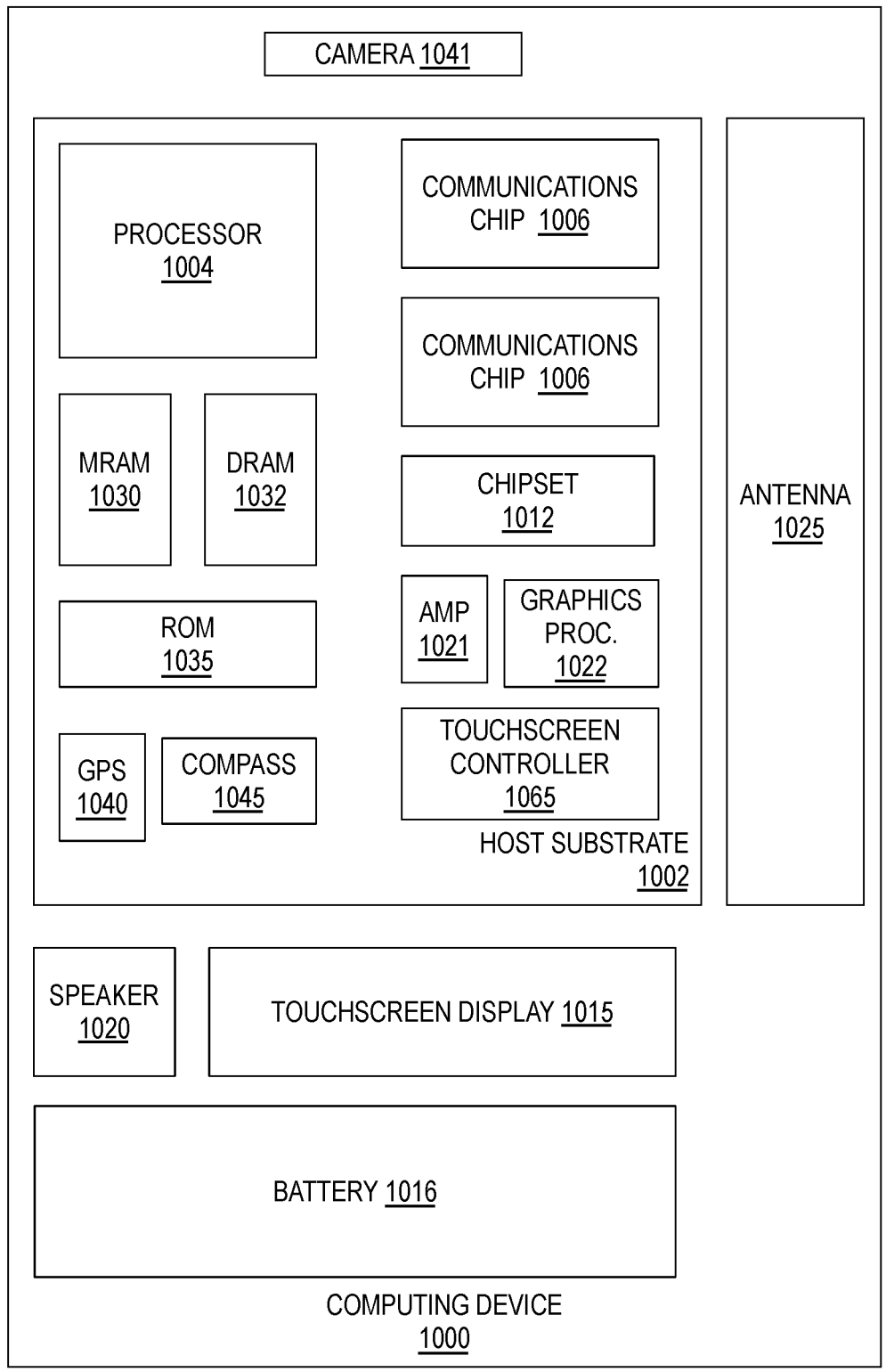
FIG. 10 is a functional block diagram of an electronic computing device, in accordance with some embodiments.

FIG. 10 is a functional block diagram of an electronic computing device 1000, in accordance with an embodiment of the present invention. Computing device 1000 may be found inside platform 905 or server platform 906, for example. Device 1000 further includes a host substrate 1002 hosting a number of components, such as, but not limited to, a processor 1004 (e.g., an applications processor with an arithmetic logic unit). Processor 1004 may be physically and/or electrically coupled to host substrate 1002. In some examples, processor 1004 includes an SRAM with a channel count contrast between the pull-down and pass-gate transistors, for example substantially as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the host substrate 1002. In further implementations, communication chips 1006 may be part of processor 1004. Depending on its applications, computing device 1000 may include other components that may or may not be physically and electrically coupled to host substrate 1002. These other components include, but are not limited to, volatile memory (e.g., DRAM 1032), non-volatile memory (e.g., ROM 1035), flash memory (e.g., NAND or NOR), magnetic memory (MRAM 1030), a graphics processor 1022, a digital signal processor, a crypto processor, a chipset 1012, an antenna 1025, touchscreen display 1015, touchscreen controller 1065, battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth), or the like. In some exemplary embodiments, at least one of the functional blocks noted above include SRAM with dipole dopant-based modulated threshold voltages, for example substantially as described elsewhere herein.

Communication chips 1006 may enable wireless communications for the transfer of data to and from the computing device 1000. The term "wireless" and its derivatives may be used to describe circuits, devices, systems, methods, techniques, communications channels, etc., that may communicate data using modulated electromagnetic radiation through a non-solid medium. The term does not imply that the associated devices do not contain any wires, although in some embodiments they might not. Communication chips 1006 may implement any of many wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the exemplary embodiments described in detail but can be practiced with modification and alteration without departing from the scope of the appended claims. For example, the above embodiments may include specific combinations of features as further provided below.

In first examples, a static random-access memory (SRAM) bit-cell structure, comprises a first transistor structure, comprising a first gate electrode around a stack of a first number of active channel regions, and a second transistor structure of a same conductivity type as the first transistor structure, the second transistor structure comprising a second gate electrode around a stack of a second number of active channel regions, greater than the first number of channel regions.

In second examples, for any of the first examples the active channel regions comprise a crystalline material, and the first transistor structure comprises an inactive channel region comprising the crystalline material.

In third examples, for any of the second examples the inactive channel region has a first concentration of an impurity exceeding a second concentration of the impurity in the first number of channel regions.

In fourth examples, for any of the third examples the impurity concentration is at least 1e19 cm-3 within the inactive channel region.

In fifth examples, for any of the third through fourth examples the first transistor structure comprises a first source region coupled to a first drain region through the first number of channel regions, the second transistor structure comprises a second source region coupled to a second drain region through the second number of channel regions, the first and second source regions and the first and second drain regions have a first conductivity type, and the inactive channel region has a second conductivity type, complementary to the first conductivity type.

In sixth examples for any of the fifth examples the first conductivity type is n-type and the impurity is boron or gallium.

In seventh examples, for any of the second through sixth examples the inactive channel region is over the first active channel regions, between a front-side metallization level and the first active channel regions.

In eighth examples, for any of the second through eighth examples the inactive channel region is under the first active channel regions, the first active channel regions between a front-side metallization level and the inactive channel region.

In ninth examples, for any of the first through eighth examples the first number of active channel regions comprise a crystalline material and the second number of active channel regions comprise the crystalline material, and individual ones of the second number of active channel regions are colinear with individual ones of the first number of active channel regions.

In tenth examples, for any of the ninth examples at least one of second number of active channel regions is coplanar with a dielectric material that is over or under the first number of active channel regions.

In eleventh examples, for any of the tenth examples the dielectric material is over the first active channel regions, between a front-side metallization level and the first active channel regions.

In twelfth examples for any of the tenth through eleventh examples the dielectric material is under the first active channel regions, the first active channel regions between a front-side metallization level and the inactive channel region.

In thirteenth examples, for any of the first through twelfth examples the first transistor is a pass-gate transistor, the second transistor is a pull-down transistor and the SRAM bit-cell structure further comprises a pair of pull-up transistors. Each of the pull-up transistors further comprises a third gate electrode around a stack of a third number of active channel regions. The third number of active channel regions is different than the first number of active channel regions.

In fourteenth examples, for any of the ninth through thirteenth examples the first gate electrode and the second gate electrode have substantially the same composition, and a first gate insulator between the first gate electrode and the first number of channel regions has substantially the same composition as a second gate insulator between the second gate electrode and the second number of channel regions.

In fifteenth examples, a device comprises a microprocessor and a power supply coupled to power the microprocessor. The microprocessor comprises an arithmetic logic unit, and a cache memory comprising an SRAM array. The SRAM array comprises a plurality of bit-cells. Each bit cell comprises a first transistor structure, comprising a first gate electrode around a stack of a first number of active channel regions, and a second transistor structure comprising a second gate electrode around a stack of a second number of active channel regions, greater than the first number of channel regions.

In sixteenth examples, for any of the fifteenth examples the device further comprises a battery coupled to the power supply.

In seventeenth examples, a method of fabricating a static random-access memory (SRAM) structure comprises receiving a transistor material stack including a plurality of bilayers comprising sacrificial material and channel material. The method comprises doping or removing at least one layer of the channel material within a first transistor region while retaining the layer of the channel material within a second transistor region. The method comprises patterning the transistor material stack into one or more fins including a first number of active channel regions within the first transistor region and a second number of active channel regions, greater than the first number, within the second transistor region. The method comprises forming a gate stack around the first number of active channel regions, and around the second number of active channel regions.

In eighteenth examples, for any of the seventeenth examples doping or removing at least one layer of the channel material within a first transistor region while retaining the layer of the channel material within a second transistor region comprises implanting an impurity within the first transistor region from either a front side or back side of the transistor material stack.

In nineteenth examples, for any of seventeenth through eighteenth examples the SRAM structure comprises n-type first and second transistors, and the impurity is a p-type impurity.

In twentieth examples, for any of the seventeenth examples doping or removing at least one layer of the channel material within a first transistor region while retaining the layer of the channel material within a second transistor region comprises etching one layer of the channel material within a first transistor region from either a front side or back side of the transistor material stack, and depositing a dielectric material coplanar with an individual one of the second number of active channel regions.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. A static random-access memory (SRAM) bit-cell structure, comprising:
   a pass-gate transistor structure of n-type conductivity, comprising a first gate electrode around a stack of a first number of active channel regions comprising a crystalline material, and an inactive channel region also comprising the crystalline material;
   a pull-down transistor structure of n-type conductivity, the pull-down transistor structure comprising a second gate electrode around a stack of a second number of active channel regions, greater than the first number of channel regions; and
   a pull-up transistor, wherein the pull-up transistor further comprises a third gate electrode around a stack of a third number of active channel regions, and wherein the third number of active channel regions is different than the first number of active channel regions.

2. The SRAM bit-cell structure of claim 1, wherein the inactive channel region has a first concentration of an impurity exceeding a second concentration of the impurity in the first number of channel regions.

3. The SRAM bit-cell structure of claim 2, wherein the first concentration of the impurity is at least 1e19 cm-3 within the inactive channel region.

4. The SRAM bit-cell structure of claim 2, wherein:
   the pass-gate transistor structure comprises a first source region coupled to a first drain region through the first number of channel regions;
   the pull-down transistor structure comprises a second source region coupled to a second drain region through the second number of channel regions;
   the first and second source regions and the first and second drain regions have N-type conductivity; and
   the inactive channel region has P-type conductivity.

5. The SRAM bit-cell structure of claim 2, wherein the impurity is boron or gallium.

6. The SRAM bit-cell structure of claim 1, wherein the inactive channel region is over the first number of active channel regions, between a front-side metallization level and the first number of active channel regions.

7. The SRAM bit-cell structure of claim 1, wherein the inactive channel region is under the first number of active channel regions, the first number of active channel regions between a front-side metallization level and the inactive channel region.

8. The SRAM bit-cell structure of claim 1, wherein:
   the first number of active channel regions comprise a crystalline material and the second number of active channel regions comprise the crystalline material; and
   individual ones of the second number of active channel regions are colinear with individual ones of the first number of active channel regions.

9. The SRAM bit-cell structure of claim 8, wherein at least one of second number of active channel regions is coplanar with the inactive channel region, which is over or under the first number of active channel regions.

10. The SRAM bit-cell structure of claim 9, wherein the inactive channel region is over the first number of active channel regions, between a front-side metallization level and the first number of active channel regions.

11. The SRAM bit-cell structure of claim 9, wherein the inactive channel region is under the first number of active channel regions, the first number of active channel regions between a front-side metallization level and the inactive channel region.

12. The SRAM bit-cell structure of claim 8, wherein:
   the first gate electrode and the second gate electrode have substantially the same composition; and
   a first gate insulator between the first gate electrode and the first number of channel regions has substantially the same composition as a second gate insulator between the second gate electrode and the second number of channel regions.

13. A device comprising:
   a microprocessor comprising:
      an arithmetic logic unit; and
      a cache memory comprising an SRAM array, wherein the SRAM array comprises a plurality of bit-cells and each bit cell comprises the SRAM structure of claim 1; and
   a power supply coupled to power the microprocessor.

14. The device of claim 13, further comprising a battery coupled to the power supply.

15. A method of fabricating a static random-access memory (SRAM) structure, the method comprising:
   receiving a transistor material stack including a plurality of bilayers comprising sacrificial material and channel material;
   electrically inactivating at least one first layer of the channel material within a pass-gate transistor region by introducing a first concentration of an impurity exceeding a second concentration of the impurity in remaining layers of the channel material without introducing the first concentration of the impurity in the first layer of the channel material within a pull-down transistor region;
   patterning the transistor material stack into one or more fins including a first number of active channel regions within the pass-gate transistor region and a second number of active channel regions, greater than the first number, within the pull-down transistor region; and
   forming a gate stack around the first number of active channel regions, and around the second number of active channel regions.

16. The method of claim 15, wherein introducing the first concentration of the impurity into the first layer of the channel material comprises:
   implanting the impurity within the first layer of the channel material from either a front side or back side of the transistor material stack.

17. The method of claim 16, wherein the SRAM structure comprises n-type pass-gate and pull-down transistors, and the impurity is a p-type impurity.

* * * * *